United States Patent [19]

De Angelo

[11] 4,096,043
[45] Jun. 20, 1978

[54] METHOD OF SELECTIVELY DEPOSITING A METAL ON A SURFACE OF A SUBSTRATE

[75] Inventor: Michael Anthony De Angelo, Ewing Township, Mercer County, N.J.

[73] Assignee: Western Electric Company, Inc., New York, N.Y.

[21] Appl. No.: 814,564

[22] Filed: Jul. 11, 1977

[51] Int. Cl.² .............................................. C25D 5/02
[52] U.S. Cl. ...................................... 204/15; 427/98; 427/305; 427/306
[58] Field of Search ............... 204/15, 20, 30; 427/98, 427/304, 305, 306; 96/38.4

[56] References Cited

U.S. PATENT DOCUMENTS

| | | | |
|---|---|---|---|
| 3,672,925 | 6/1972 | Feldstein | 427/98 |
| 3,676,213 | 7/1972 | Marton | 427/98 |
| 3,775,121 | 11/1973 | Sharp | 96/38.4 |
| 3,949,121 | 4/1976 | Kenney | 427/98 |
| 3,950,570 | 4/1976 | Kenney | 427/305 |
| 4,021,314 | 5/1977 | Drafter, Jr. | 427/305 |

*Primary Examiner*—T. M. Tufariello
*Attorney, Agent, or Firm*—J. Rosenstock

[57] ABSTRACT

A method of selectively depositing a metal on a surface of a substrate is disclosed. A suitable substrate is selected and a surface is treated with a desensitizer selected from the group consisting of (a) hydrazine, (b) a substituted hydrazine having the structural formula

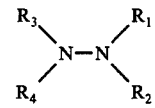

where $R_1$ is an organic radical selected from the group consisting of alkyl, cycloalkyl, aryl, alkaryl, aralkyl, alkoxy, aryloxy and heterocyclic radicals and $R_2$, $R_3$ and $R_4$ are the hydrogen radical or are the same as $R_1$, and (c) a mixture of the foregoing. The desensitizer-treated surface is selectively exposed to a source of ultraviolet radiation to render selected areas thereof incapable of desensitizing a sensitizing species. The radiation-exposed surface is treated with a sensitizing species to sensitize the selected areas.

18 Claims, 3 Drawing Figures

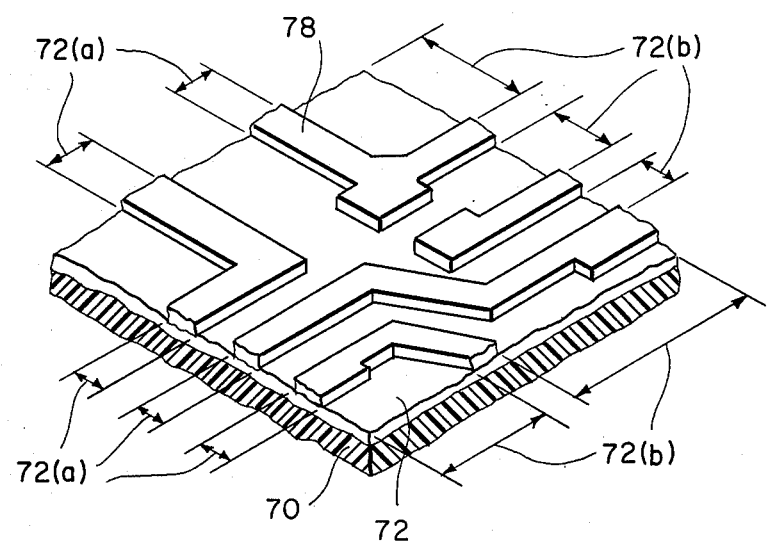
FIG_3

METHOD OF SELECTIVELY DEPOSITING A METAL ON A SURFACE OF A SUBSTRATE

BACKGROUND OF THE INVENTION

1. Field of the Invention

This invention relates to a method of selectively depositing a metal on a surface of a substrate and more particularly, to depositing a metal pattern on a nonconductive substrate utilizing a method comprising an exposure to a source of ultraviolet radiation.

2. Description of the Prior Art

There is a growing need in various device and circuit applications for an inexpensive process which will produce adherent conducting circuit patterns on a nonconductive surface. Most of the processes used for metallic pattern generation involve a photographic step. Pattern resolution may be good but most methods are often slow, involving many process steps, and are relatively expensive.

A conventional method for producing macro circuit patterns employs a copper-clad insulator board coated with a photoresist material which is photoexposed and chemically processed to selectively remove copper, leaving a desired circuit pattern. This method is effective but wasteful of copper and chemicals.

An electroless metal deposition process is especially attractive for metallic pattern generation since one only needs to produce a pattern of a suitable catalyst on a substrate and metal deposition will occur only on that pattern. Generally speaking, a conventional electroless plating process includes sensitizing an electrically non-conducting surface with a sensitizer, e.g., a stannous chloride solution. The surface is then immersed in an activating solution, comprising an activating metal salt, e.g., a noble metal salt, wherein an activating metal is reduced on the surface. The activating metal-reduced surface is then subjected to an electroless metal deposition bath, which is catalyzed by the reduced activating metal, and wherein an electroless metal deposit is obtained.

A refinement of the conventional electroless plating process is necessary when the electrolessly plated metal is electrolessly deposited onto selected portions of a substrate surface in a pattern rather than on the entire surface, to produce a printed circuit board. An electroless process whereby (1) selective metal deposition is attained in a continuous manufacturing process (as compared to a one-at-a-time non-continuous process) and (2) metallic patterns are generated wherein individual pattern portions have required dimensions or widths, or wherein individual pattern portions are separated by required distances is needed.

SUMMARY OF THE INVENTION

This invention relates to a method of selectively depositing a metal on a surface of a substrate, and more particularly, to depositing a metal pattern on a non-conductive substrate utilizing a method comprising an exposure to a source of ultraviolet radiation.

A surface of a substrate is treated with a desensitizer selected from the group consisting of (a) hydrazine, (b) a substituted hydrazine having the structural formula

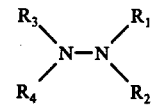

where $R_1$ is an organic radical selected from the group consisting of alkyl, cycloalkyl, aryl, alkaryl, aralkyl, alkoxy, aryloxy and heterocyclic radicals and $R_2$, $R_3$ and $R_4$ are the hydrogen radical or are the same as $R_1$, and (c) a mixture of the foregoing. The desensitizer-treated surface is selectively exposed to a source of ultraviolet radiation to render selected areas thereof incapable of desensitizing a sensitizing species. The radiation exposed surface is treated with a sensitizing species to sensitize the selected areas.

BRIEF DESCRIPTION OF THE DRAWINGS

The present invention will be more readily understood by reference to the following drawing taken in conjunction with the detailed description, wherein:

FIG. 3 is a partial isometric view of the substrate of FIG. 1 having thereon an electroless metal-deposited pattern.

DETAILED DESCRIPTION

The present invention has been described primarily in terms of depositing copper on a surface of an insulative substrate. It will be readily appreciated that the inventive concept is equally applicable to depositing other suitable metals, which are catalytically reduced from their respective ions in an electroless metal deposition bath by catalytic activating or noble metals.

Figure 1:
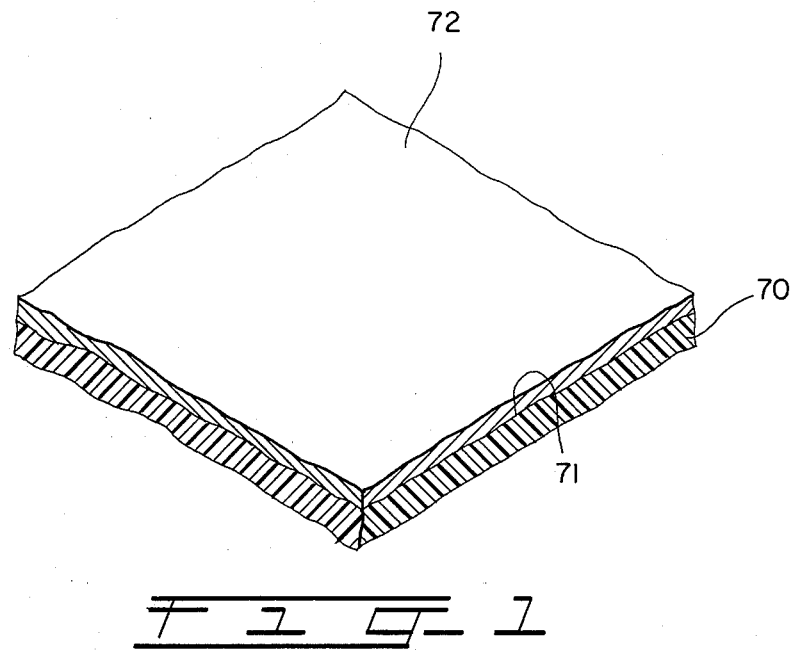
FIG. 1 is a partial isometric view of a non-conductive substrate having a desensitizer layer.

Referring to FIG. 1, there is shown a portion of a suitable substrate 70. For the production of electrical circuit patterns, suitable substrates are those which are generally electrically non-conductive. In general, all dielectric materials are suitable substrates. A particularly suitable substrate comprises a polyimide. A suitable polyimide includes any polyimide of a polyamide-acid having the formula

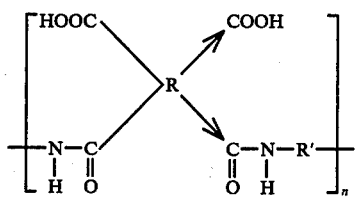

where the arrows denote isomerism, R is an organic tetravalent radical containing at least two carbon atoms, no more than 2 carbonyl groups of each polyamide-acid unit being attached to any one carbon atom of said tetravalent radical; R' is a divalent radical containing at least two carbon atoms, the amide groups of adjacent polyamide-acid units each attached to separate carbon atoms of said divalent radical; and n is a positive integer sufficient to provide the polyamide acid with an inherent viscosity of at least 0.1. Typical of such a polyimide is "Kapton." "Kapton" is a polyimide formed from pyromellitic dianhydride

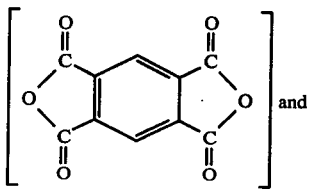

and 4,4'-diamino-diphenyl ether

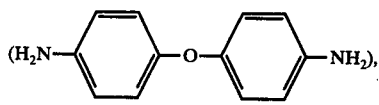

and which has a general formula

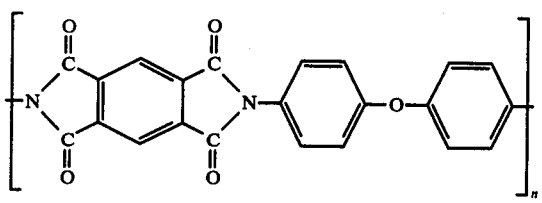

where *n* is an integer ranging from 150 to 650, and which has an average molecular weight ranging from 60,000 to 250,000. The above polyimides and their preparation are fully described in Edwards, U.S. Pat. No. 3,179,614, incorporated by reference hereinto.

A surface 71 of substrate 70 is treated, e.g., by immersion, spraying, etc., with a solution comprising a desensitizer, e.g., a 5 to 85 weight percent aqueous hydrazine solution, to form a desensitizer layer or film 72 (greatly enlarged for illustrative purposes only). The desensitizer from the desensitizer solution is either adsorbed (deposited) onto surface 71 or absorbed into surface 71 to form layer 72. The amount of desensitizer comprising layer 72 should be sufficient to desensitize an electroless metal deposition sensitizer. The term "desensitize" means to deactivate a sensitizing species, comprising the electroless metal-deposition sensitizer, by means of an interreaction with a selected desensitizer, e.g., a compound, mixture of compounds, whereby the sensitizing species can no longer act as a sensitizing species in an electroless metal deposition sequence. In particular, the sensitizing species is no longer capable of reacting with an activating or noble metal species, e.g., $Pd^{+2}$, to form a catalytic activating metal or noble metal, e.g., $Pd^0$. The concentration of the desensitizer in layer 72 is easily ascertained experimentally by one skilled in the art in view of the disclosure contained herein. Typically, for a 5 to 85 weight percent aqueous hydrazine solution, surface 71 is treated therewith for 1 to 5 minutes at 25° C. whereby an adequate densensitizer layer 72 is obtained.

Suitable desensitizers include (a) hydrazine, (b) a substituted hydrazine having the structural formula

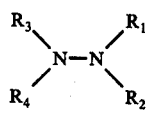

where $R_1$ is an organic radical selected from the group consisting of alkyl, cycloalkyl, aryl, alkaryl, aralkyl, alkoxy, aryloxy, and heterocyclic radicals and $R_2$, $R_3$ and $R_4$ are the hydrogen radical, H, or are the same as $R_1$, and (c) mixtures of the foregoing.

The desensitizer may be employed in a wide variety of ways to form desensitizer layer 72. For example the desensitizer may be combined or dissolved in an appropriate solvent and surface 71 exposed thereto by immersion, brushing, spraying, etc. Any solvent which is chemically compatible with the desensitizer and substrate 70 may be used. Besides water, organic solvents such as saturated and unsaturated alkyl hydrocarbons, as well as aryl, alkyl aryl and aryl/alkyl hydrocarbons may be used. Halogenated forms of such hydrocarbons are also suitable. Polar organic solvents such as aldehydes, ketones, or alcohols may also be used.

The desensitizer treated surface 71 may then be water rinsed and then dried to form layer 72. It is to be noted that the desensitizer treated surface 71 should not be water rinsed over an extended period of time since the desensitizer species, e.g., hydrazine, will decompose and become ineffective. Typically the densensitizer treated surface is water rinsed for about 1 minute at 25° C.

A suitable electroless metal deposition sensitizer comprises a sensitizing species which is readily oxidized by an activating metal species, such as, for example, $Pd^{+2}$, $Pt^{+2}$ ions. Some typical sensitizing species include species such as $Sn^{+2}$, $Ti^{+3}$, $Pb^{+2}$, $Hg_2^{+2}$ ions, etc., which are well known in the art of electroless metal deposition.

Figure 2:
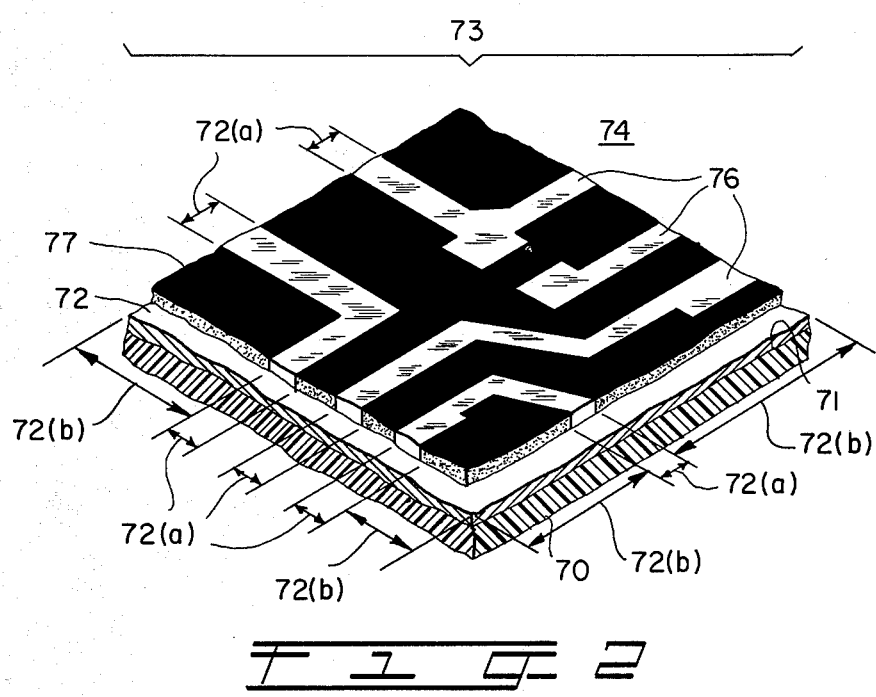
FIG. 2 is a partial isometric view of the substrate of FIG. 1 being selectively exposed to a source of ultraviolet radiation through a suitable mask.

Referring to FIG. 2, a suitable mask 74 is placed adjacent to desensitizer layer 72. Mask 74 is a negative mask, i.e., has areas 76 which are capable of transmitting therethrough a desired radiation to which negative mask 74 and ultimately, desensitizer layer 72 is destined to be exposed, which areas correspond to a desired electroless metal-deposited pattern. Negative mask 74 has areas 77 which are opaque to the desired radiation to which negative mask 74 and desensitizer layer 72 are destined to be exposed. It should be noted that in the alternative, separate masking layers may be applied to layer 72, utilizing standard materials and techniques known in the art.

A suitable radiation source 73 is selected. A suitable radiation source typically includes an ultraviolet radiation source having a wavelength in the range of 1800A. to 2900A. Radiation source 73, e.g., an ultraviolet radiation source having a wavelength ranging from 1800A. to 2900A., is placed above mask 74 and directed thereat, either in an oxidizing or non-oxidizing ambient. A plurality of rays having a suitable wavelength, e.g., ranging from 1800A. to 2900A., passes through or is transmitted through areas 76 of mask 74 to expose areas 72(a) of densensitizer layer 72 thereto. The thus exposed areas 72(a) of the desensitizer species containing layer 72, underlying and corresponding to areas 76 of the negative mask 74, are thereby rendered incapable of densensitizing an electroless metal deposition sensitizing species to which substrate 70 is destined to be exposed.

A desensitizer species containing pattern or outline delineated by ultraviolet radiation exposure, which is incapable of desensitizing a sensitizer species and thus is capable of participating in an electroless metal deposition process is thus established.

It is to be noted at this point that layer 72 contained on surface 71 is expcsed to ultraviolet radiation source 73 for a period of time sufficient to render areas 72(a) incapable of desensitizing an electroless metal deposition sensitizer species. Such a period of time is readily ascertained experimentally by one skilled in the art for a particular ultraviolet radiation source. It is to be noted, however, that the time of exposure is interdependent upon the intensity of source 73, i.e., upon the energy transmitted by source 73 to layer 72. This interdependency is well known in the art or is easily ascertained experimentally by one skilled therein. The amount of energy supplied to desensitized layer 72 by source 73, however, is not found to be critical and a typical exposure may range from 1 to 5 minutes at an intensity ranging from about 100 to about 500 microwatts/cm$^2$, at wavelengths ranging from 1800A. to 2900A., for a desensitizer layer 72 formed by treatment of a polyimide surface 71 for 5 minutes at 25° C. with a 50 to 85 weight percent aqueous hydrazine solution.

The resultant radiation-exposed substrate 70 is treated, e.g., as by immersion, spraying, etc., with an electroless metal deposition sensitizer solution comprising a sensitizer species, e.g., $Sn^{+2}$, $Ti^{+3}$, $Pb^{+2}$, $Hg_2^{+2}$ ions, etc., to selectively sensitize only radiation exposed areas 72(a) of layer 72. Sensitization is a conventional process in the electroless deposition art and consists of depositing or absorbing on the surface of areas 72(a) a sensitizing species, e.g., $Sn^{+2}$, $Ti^{+3}$, etc., ions, which are readily oxidized. It is to be understood that the sensitizing solutions and conditions and procedures of sensitizing are well known in the art and will not be elaborated herein. Such sensitizers and procedures may be found, in part, in *Metallic Coating of Plastics*, William Goldie, Electrochemical Publications, 1968.

Particularly suitable are preferred sensitizers comprise $Sn^{+2}$ sensitizing species. Some of these sensitizers include aqueous solutions of stannous salts, e.g., stannous chloride. Also suitable are the colloidal stannous oxide containing hydrosols revealed in U.S. Pat. No. 3,657,003, incorporated hereinto by reference.

The remaining areas 72(b) of layer 72 which were not exposed to the radiation are not sensitized due to the fact that the desensitizer species contained thereon or therein functions to desensitize the sensitizing species, e.g., $Sn^{+2}$, $Ti^{+3}$, to which it is exposed. The sensitizing species, e.g., $Sn^{+2}$, $Ti^{+3}$, etc., deposited on the radiation-unexposed areas 72(b) are thus unable to participate in as electroless metal deposition as by reacting with an activating metal ion.

After the selective sensitization of substrate 70, sensitized areas 72(a) are water rinsed and activated. Activation relates to providing a deposit of catalytic metal, e.g., noble metals such as Ir, Os, Pd, Pt, Rh, Rd, Au, Ag, over the sensitized surface of areas 72(a) in sufficient quantities to successfully catalyze a plating reaction once the sensitized surface of areas 72(a) is introduced into an electroless metal deposition solution. The sensitized surface of areas 72(a) so capable of reducing an activating material, e.g., $Pd^0$, from an activating metal salt, e.g., $PdCl_2$, is exposed to the activating metal salt, e.g., $PdCl_2$, whereby the activating metal salt is reduced to the activating metal, e.g., $Pd^0$, which in turn is deposited thereon. The deposited activating metal, e.g., $Pd^0$, acts as a catalyst for localized further plating. It is to be understood that the various activating metal ions and their solutions, and the conditions and procedures of activation are well known in the art and will not be elaborated herein. Such activators and procedures may be found, in part, in *Metallic Coating of Plastics*, previously referred to. Again, it is to be noted that areas 72(b) cannot be so activated.

Referring to FIG. 3, after activation, activated substrate 70 may be rinsed with water, typically for 1 to 2 minutes at 25° C., whereafter it is immersed in a suitable electroless metal deposition solution wherein an electroless metal ion, e.g, $Cu^{+2}$, is reduced to the metal, e.g., $Cu^0$, and deposited on areas 72(a) of substrate 70 to form an electroless metal deposit 78. A suitable electroless metal deposition solution comprises a metal ion, e.g., $Cu^{+2}$, which is catalytically reduced to its corresponding metal, e.g., $Cu^0$, by a suitable reducing agent, e.g.,

in the presence of a catalytic species, e.g., an activating metal such as Pd.

After a suitable electroless deposit is obtained, typically 3 to 10 micro-inches in thickness, electroless metal deposit 78 may then be further built up by prolonged immersion in the electroless metal deposition solution or alternatively by being electroplated in a standard electroplating bath. It is to be noted that the various typical electroless and electroplating solutions, plating conditions and procedures are well known in the art and will not be elaborated herein. Reference in this regard is again made to *Metallic Coating of Plastics*, William Goldie, previously referred to. It is to be noted that the invention disclosed herein may be employed in the production of electrical circuit patterns on a non-conductive substrate, in a similar fashion to that revealed in U.S. Pat. RE. No. 29,015 assigned to the assignee hereof and incorporated by reference herein. In this regard, referring back to FIG. 2, areas 72(a) of layer 72 constitute a portion of a pattern conforming to a desired electrical circuit pattern. Referring to FIG. 3, electroless deposit 78 obtained constitutes a portion of the electrical circuit pattern. The resulting electrical circuit pattern, partially represented by deposit 78 (FIG. 3) may be electroplated to a desired thickness to obtain the desired circuit pattern.

In another embodiment, referring back to FIG. 1, surface 71 of substrate 70 may be selectively treated or coated with a desensitizer, e.g., a hydrazine solution, to delineate an untreated or uncoated surface pattern corresponding to areas 72(a) of FIG. 2. The delineated, untreated pattern is capable of participating in an electroless metal deposition process, that is a process involving sensitization, activation and electroless metal deposition upon exposure to an electroless metal deposition solution. The selectively coated substrate 70 is then treated with an electroless metal deposition sensitizer solution comprising a sensitizer species, e.g., $Sn^{+2}$ ions, to sensitize the uncoated, delineated pattern corresponding to area 72(a) (FIG. 2). The desensitizer-coated areas of surface 71 [corresponding to areas 72(b) of FIG. 2] are not sensitized due to the fact that the desensitizer species contained thereon or therein functions to desensitize the sensitizing species. The selectively sensitized substrate 70 is then activated and treated with an electroless metal deposition solution to deposit thereon an electroless metal deposit corresponding to deposit 78 of FIG. 3.

Of course, alternatively surface 71 of substrate 70 may first be blanket sensitized with an electroless metal deposition sensitizer followed by the selective treatment or coating with the desensitizer to delineate the untreated surface pattern capable of participating in the electroless metal deposition process.

EXAMPLE I

A polyimide substrate, comprising "Kapton," which is a polyimide made from the anhydride of pyromellitic acid and 4,4' diamino-diphenyl ether, and is represented as having a general formula

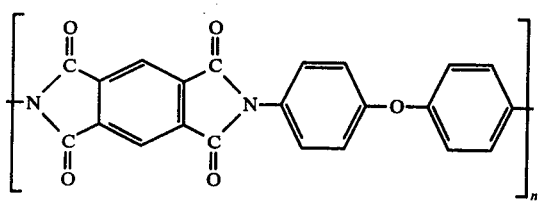

where $n$ is an integer ranging from 150 to 650, and having an average molecular weight of 60,000 to 250,000, was treated with a 64 weight percent aqueous hydrazine solution for 5 minutes at 25° C. The treated substrate was rinsed for one minute with deionized water, dried with a nitrogen gas stream at 25° C. for 30 seconds and then selectively exposed to ultraviolet radiation with a 900 watt xenon lamp for 2 minutes at a distance of one foot, whereby a selected portion of the surface was rendered incapable of desensitizing a sensitizer. The selective radiation exposed substrate was then sensitized (on the selected portion) by immersion in an aqueous sensitizing solution comprising 3 weight percent of $SnCl_2$, and one weight percent of $SnCl_4$. The resultant selectively sensitized substrate was rinsed for 1 minute in deionized water at 25° C. and then activated by immersion in an aqueous solution comprising 0.05 weight percent $PdCl_2$ with 0.1 weight percent HCl. The activated substrate was rinsed with deionized water and then immersed in an electroless copper deposition solution, commercially obtained, comprising cupric sulfate, formaldehyde, complexer and caustic, wherein an electroless copper metal deposit covering only the radiation-exposed portion of the surface was obtained. The electroless deposit had a thickness of about 5 micro-inches.

EXAMPLE II

The procedure of Example I was repeated except that the hydrazine treated substrate was selectively exposed to a mercury lamp at a distance of 4 inches for 5 minutes (150 microwatts/cm$^2$), whereby a selected portion of the surface was rendered incapable of desensitizing a sensitizer. An electroless metal deposit (5 micro-inches in thickness) was obtained only on the radiation-exposed portion of the substrate.

It is to be understood that the above-described embodiments are simply illustrative of the principles of the invention. Various other modifications and changes may be made by those skilled in the art which will embody the principles of the invention and fall within the spirit and scope thereof.

What is claimed is:

1. A method of selectively depositing a metal on a surface of a substrate which comprises:
   (a) treating the surface with a desensitizer comprising hydrazine;
   (b) selectively exposing said desensitizer-treated surface to a source of ultraviolet radiation to render a selected area thereof incapable of desensitizing a sensitizing species; and
   (c) treating said radiation-exposed surface with a sensitizing species to sensitize said selected area.

2. The method as defined in claim 1 which further comprises:
   exposing at least said sensitizing area to an activating solution to activate said area.

3. The method as defined in claim 2 which further comprises:
   exposing said activated area to an electroless metal deposition solution to deposit an electroless metal thereon.

4. The method as defined in claim 3 which further comprises electroplating said electroless metal deposit.

5. The method as defined in claim 1 wherein said sensitizing species comprises a $Sn^{+2}$ species.

6. The method as defined in claim 1 wherein said substrate surface comprises a polyimide.

7. A method of forming an activated pattern on a surfaced of a substrate, the pattern being usable to catalyze and reduce thereon an electroless metal deposit from an electroless metal deposition solution, which comprises:
   (a) treating the surface with a desensitizer comprising hydrazine;
   (b) exposing a selected portion of said desensitizer-treated surface to a source of ultraviolet radiation to delineate an exposed pattern corresponding to the activated pattern,
   (c) treating said ultraviolet radiation-exposed surface to a sensitizer to sensitize said exposed pattern, and
   (d) exposing said sensitized pattern to an activator to form the activated pattern.

8. The method as defined in claim 7 wherein:
   said sensitizer comprises a stannous species, and said activator comprises a $Pd^{+2}$ species.

9. The method as defined in claim 7 wherein said surface comprises a polyamide.

10. A method of producing an electrical circuit pattern on a non-conductive substrate, which comprises:
    (a) treating a surface of the substrate with a desensitizer comprising hydrazine;
    (b) selectively exposing said desensitizer-treated surface to a source of ultraviolet radiation to form an exposed pattern corresponding to the electrical circuit pattern;
    (c) treating said radiation-exposed surface with a sensitizer to sensitize said exposed pattern; and
    (d) activating the sensitized pattern to form an activated pattern.

11. The method as defined in claim 10 which further comprises:
    treating said activated pattern with an electroless metal deposition solution to deposit on electroless metal deposit thereon.

12. The method as defined in claim 10 wherein:
    said sensitizer comprises a tin species.

13. The method as defined in claim 10 wherein said surface comprises a polyimide.

14. A method of selectively depositing a metal on a dielectric surface which comprises selectively treating the surface with a desensitizer comprising hydrazine to delineate an untreated surface pattern which is capable of participating in an electroless metal deposition process.

15. A method of selectively depositing a metal on a dielectric surface which comprises:

treating the surface with an electroless metal deposition sensitizer to sensitize the surface, and selectively coating said sensitized surface with a desensitizer comprising hydrazine to delineate a sensitized pattern thereon.

16. The method as defined in claim 15 which further comprises exposing at least said sensitized pattern to an activating solution to activate said pattern.

17. The method as defined in claim 16 which further comprises treating said activated pattern with an electroless metal deposition solution to deposit an electroless metal thereon.

18. The method as defined in claim 17 which further comprises electroplating said electroless metal deposit.

* * * * *

UNITED STATES PATENT OFFICE
CERTIFICATE OF CORRECTION

Patent No. 4,096,043    Dated June 20, 1978

Inventor(s) M. A. DeAngelo

It is certified that error appears in the above-identified patent and that said Letters Patent are hereby corrected as shown below:

In the claims, Column 8, line 7, "sensitizing" should read --sensitized--; line 39, "polyamide" should read --polyimide--; line 55, "deposit on" should read --deposit an--.

Signed and Sealed this

Fifth Day of December 1978

[SEAL]

Attest:

RUTH C. MASON
Attesting Officer

DONALD W. BANNER
Commissioner of Patents and Trademarks